(12) United States Patent
McKnight et al.

(10) Patent No.: US 6,433,465 B1
(45) Date of Patent: Aug. 13, 2002

(54) ENERGY-HARVESTING DEVICE USING ELECTROSTRICTIVE POLYMERS

(75) Inventors: William H. McKnight; Wayne C. McGinnis, both of San Diego, CA (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 0 days.

(21) Appl. No.: 09/564,370

(22) Filed: May 2, 2000

(51) Int. Cl.⁷ .................................................. H02N 2/18
(52) U.S. Cl. ........................................ 310/339; 310/319
(58) Field of Search ............................................ 310/339

(56) References Cited

U.S. PATENT DOCUMENTS

| | | | |
|---|---|---|---|
| 4,748,366 A | 5/1988 | Taylor | 310/328 |
| 4,814,661 A | 3/1989 | Ratzlaff et al. | 310/328 |
| 5,188,447 A | 2/1993 | Chiang et al. | 362/103 |
| 5,495,136 A | 2/1996 | Chiang et al. | 310/339 |
| 5,500,635 A | 3/1996 | Mott | 340/323 R |
| 5,548,177 A | 8/1996 | Carroll | 310/339 |
| 5,552,656 A | 9/1996 | Taylor | 310/337 |
| 5,552,657 A | 9/1996 | Epstein et al. | 310/339 |
| 5,621,264 A | 4/1997 | Epstein et al. | 310/339 |
| 5,801,475 A | * 9/1998 | Kimura | 310/319 |
| 5,835,453 A | * 11/1998 | Wynne et al. | 367/140 |

FOREIGN PATENT DOCUMENTS

EP        0 121 026 A1 * 10/1984

OTHER PUBLICATIONS

A. Petersen, "Harness Solar Power with Smart Power–Conversion Techniques", *Electronic Data News*, Feb. 4, 1999 edition, pp. 119–124.

* cited by examiner

*Primary Examiner*—Thomas M. Dougherty
(74) *Attorney, Agent, or Firm*—Harvey Fendelman; Michael A. Kagan; Peter A. Lipovsky (57) ABSTRACT

The electrical response phenomenon of electrostrictive polymers is used to harvest electrical power from the general movement of objects such as from human walking motion, for example. In a preferred embodiment of the invention, the polymer material is incorporated into the soles of footwear and is either full- or partial-wave rectified and then if desired converted to a direct current (DC) voltage level for suitable battery charging and the like.

14 Claims, 9 Drawing Sheets

ENERGY-HARVESTING DEVICE USING ELECTROSTRICTIVE POLYMERS

BACKGROUND OF THE INVENTION

This invention relates generally to materials that generate electricity upon being deformed. More particularity, the invention pertains to the use of electrostrictive polymers for energy generation.

Approaches to developing footwear for energy harvesting from walking motion, for example, have centered around the use of piezoelectric materials. Piezoelectric materials deform minutely with each step, thereby providing only small, relatively inefficient, voltage generation.

A need thus exists for a highly deformable energy producing substance that can be readily incorporated into articles of clothing and that can efficiently produce motion-generated power for a variety of uses.

SUMMARY OF THE INVENTION

Electrostrictive (or synonymously, electroactive) polymers have been known to be used as low-mass actuators (artificial muscles). In one such artificial muscle application, a voltage is applied across the electrostrictive polymer via electrodes, causing the polymer to bend, stretch, or otherwise move or deform. The electrostrictive polymers can be dimensionally altered to a much greater extent than piezoelectric materials. The present invention uses the electrical response phenomenon of electrostrictive polymers in reverse to harvest or generate electrical power from the general movement of objects such as from human walking motion, for example. In a preferred embodiment of the invention, the polymer material is incorporated into the soles of footwear and is either full- or partial-wave rectified and then if desired converted to a direct current (DC) voltage level suitable for battery charging and the like.

OBJECTS OF THE INVENTION

An object of this invention is to provide a highly deformable energy-generating substance to objects of motion so that energy may be generated efficiently via motion of the object.

Another object of this invention is to provide a highly deformable energy-generating substance to articles of clothing so that energy may be generated efficiently via motion of the body of a wearer of such articles.

A further object of this invention is to provide deformable energy-generating electrostrictive polymers to articles of clothing so that energy may be generated efficiently via motion of the body of a wearer of such articles.

Other objects, advantages, and new features of this invention will become apparent from the following detailed description of the invention when considered in conjunction with the accompanied drawings.

DESCRIPTION OF THE PREFERRED EMBODIMENT

Figure 1:
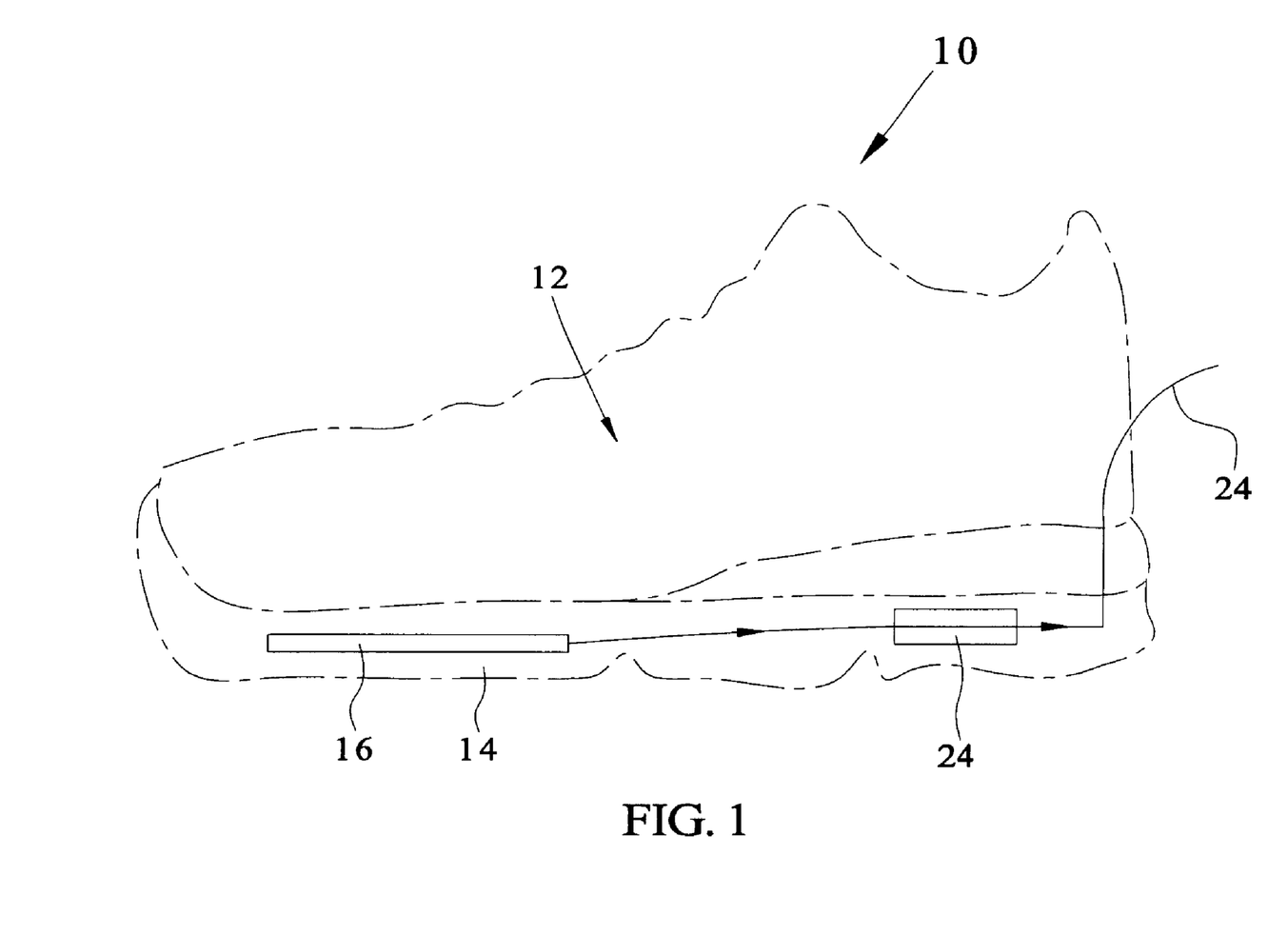
FIG. 1 is a representative embodiment of the invention incorporating energy-generating polymers within the sole of foot apparel for generating electrical energy upon flexure of the sole.

Referring now to FIG. 1, a representative use of the invention is shown as incorporated in the form of footwear 10. Shown is an individual shoe 12 incorporating the invention, however one will realize that either or both shoes of a wearer could be designed and built to utilize the energy harvesting feature of the invention. Similarly, other items or portions of apparel can be used to take advantage of the energy-producing capability of the invention.

Referring again to FIG. 1, shoe 12 has incorporated into its sole 14 a section 16 of a non-piezoelectric, electrostrictive polymer. The polymer may be arranged in any of a variety of ways as will be discussed. Some candidate polymers for this application are, for example, polyacrylic acid, often referred to as PAA, and polyvinyl chloride (PVC). In addition, poly (3,3'-phthalidylidene-4,4'-biphenylylene), abbreviated PPB, is a candidate electrostrictive polymer for this application.

Figure 2:
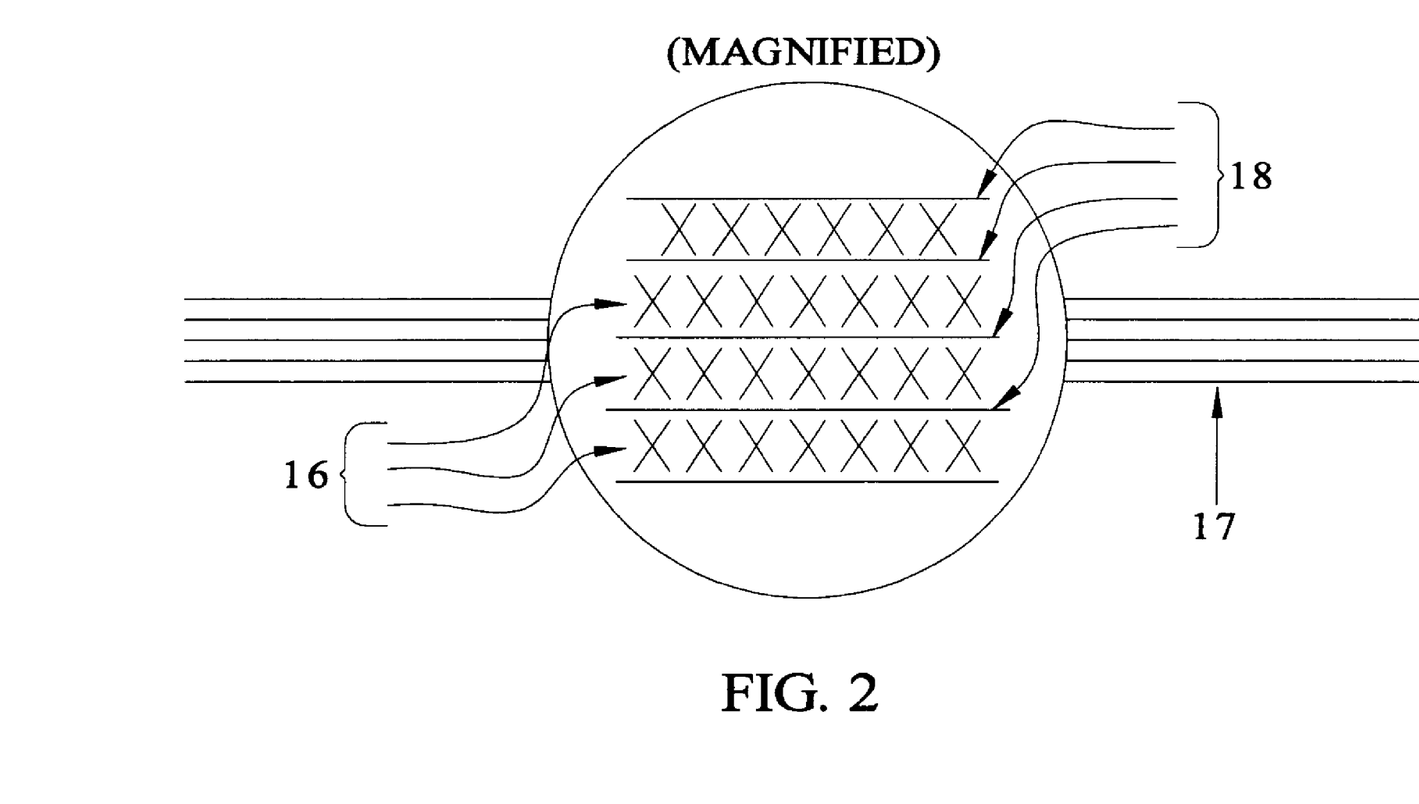
FIG. 2 shows one orientation of energy-producing polymers as may be used in the invention with accompanying electrodes illustrated.

A promising polymer-electrode configuration for power generation, for example, is essentially a sandwich structure 17 as illustrated in FIG. 2, where polymer material 16 and electrodes 18 are interleaved. The combination of polymers cladded between conductive sheets may be called ion-exchange polymer-metal composites or IPMCs for short.

Figure 3A:
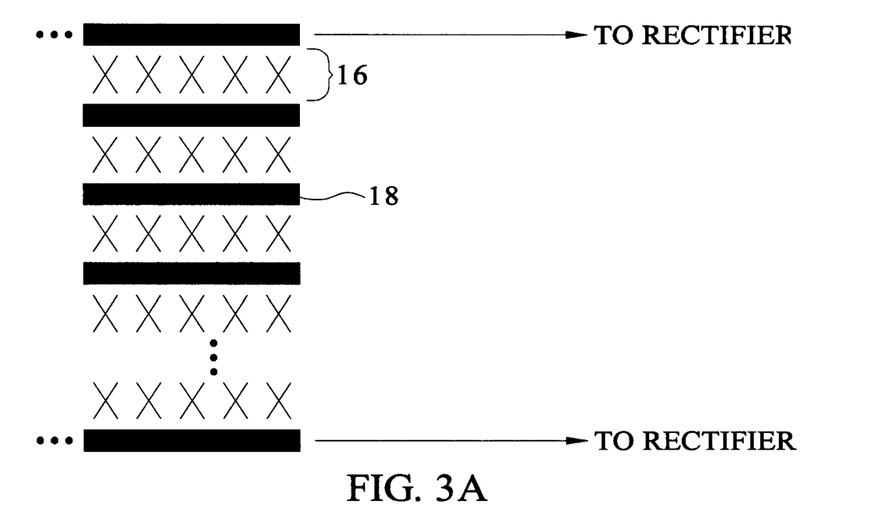
FIGS. 3A and B illustrate series and parallel wiring of conductive cladded polymers, respectively.

In the preferred embodiment shown, the electrodes are preferably wired (hooked-up) in a "series" configuration as shown in FIG. 3A. In this configuration, adjacent positive electrodes are attached to nearest neighbor negative electrodes, etc. This series hook-up configuration for the interleaved electrodes permits the voltages generated across each polymer to be added, so that a relatively high ultimate output voltage is generated by the system.

Figure 3B:
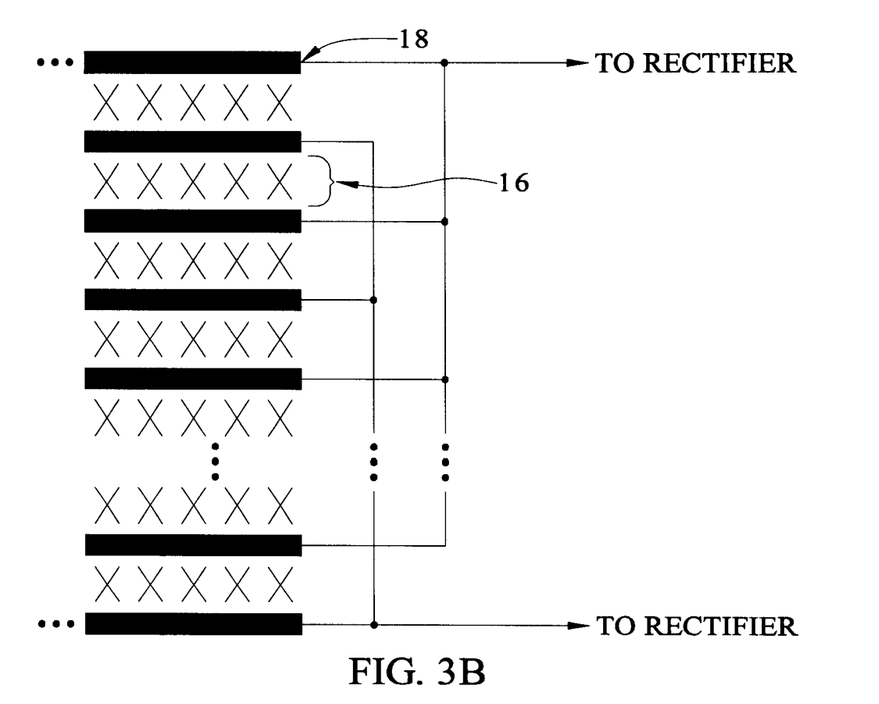

Alternatively, a parallel hook-up may be provided as illustrated in FIG. 3B. In yet another configuration, combinations of series and parallel hook-ups are possible.

Figure 4:
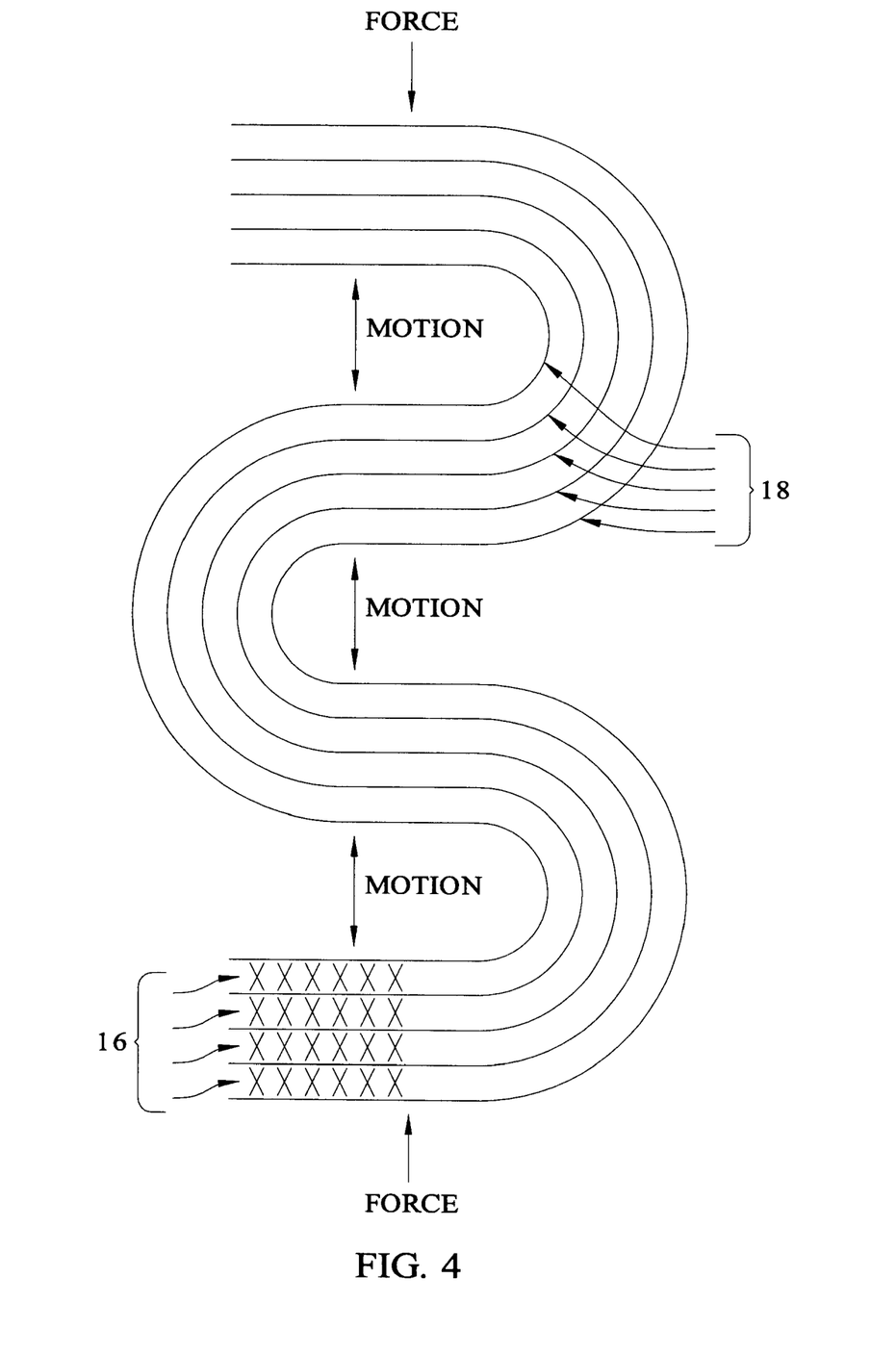
FIG. 4 shows another orientation of energy-producing polymers as may be used in the invention with accompanying electrodes illustrated.

FIG. 4 depicts a sinuous arrangement of the polymer electrode sandwich structure, with electrodes preferably wired in series, so that forces or pressure applied from above and/or below will cause the sandwich structure to flex/compress and then decompress as the forces come and go. This motion will allow a voltage to be generated across the electrodes in accordance with the amount of bending and/or compression of the stricture.

Figure 5:
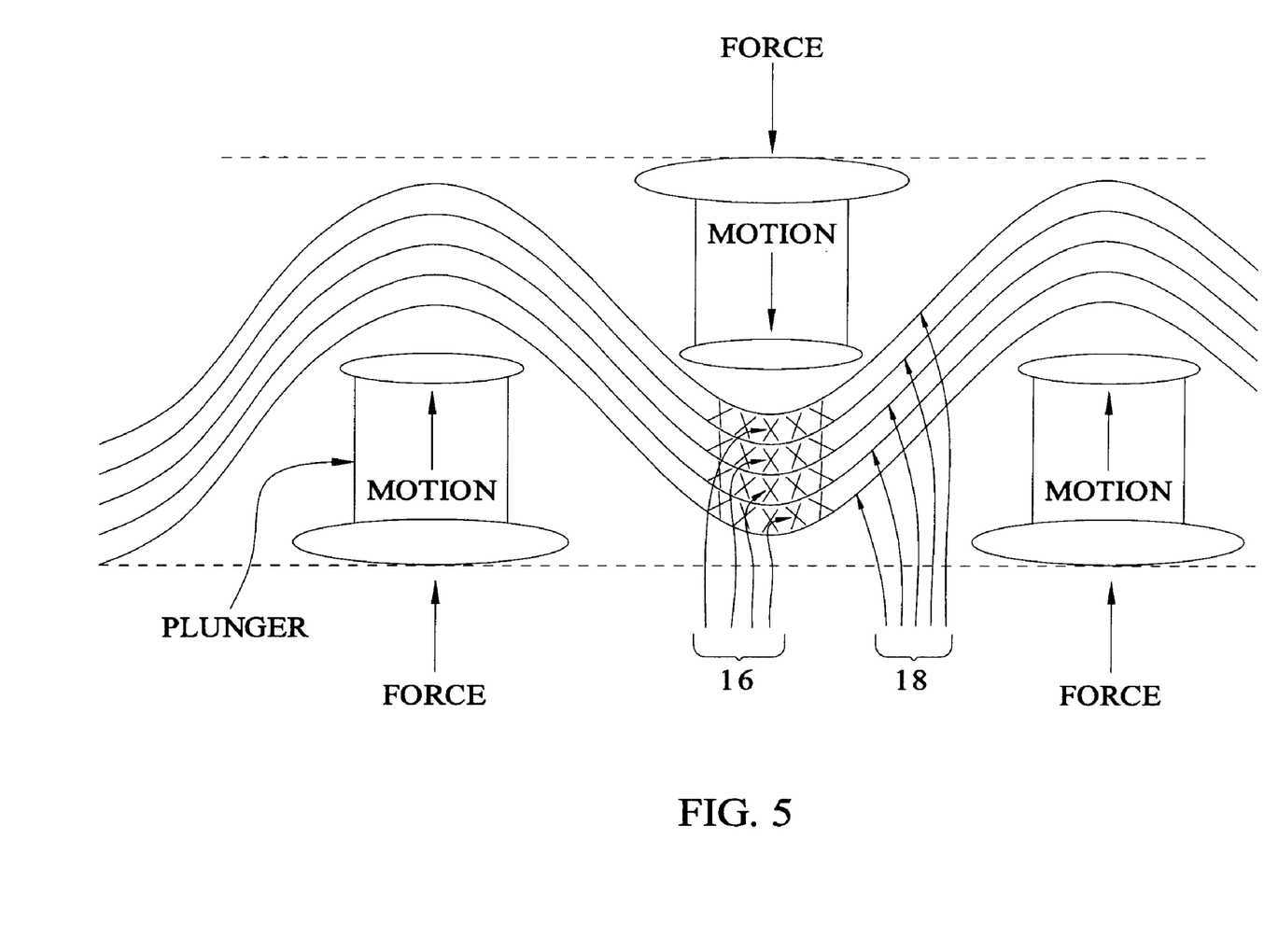
FIG. 5 shows yet a third orientation of energy-production may polymers be used in the invention with accompanying electrodes and distortion-promoting plungers illustrated.

FIG. 5 depicts an arrangement of this sandwich structure of interleaved electrodes and polymer, again with electrodes wired in series, such that semi-rigid incorporated plungers 20 are allowed and are configured to move vertically in response to applied vertical forces which come and go. This movement of plungers 20 will, in turn, cause the sandwich structure to bend and flex, once again generating voltage.

Figure 6:
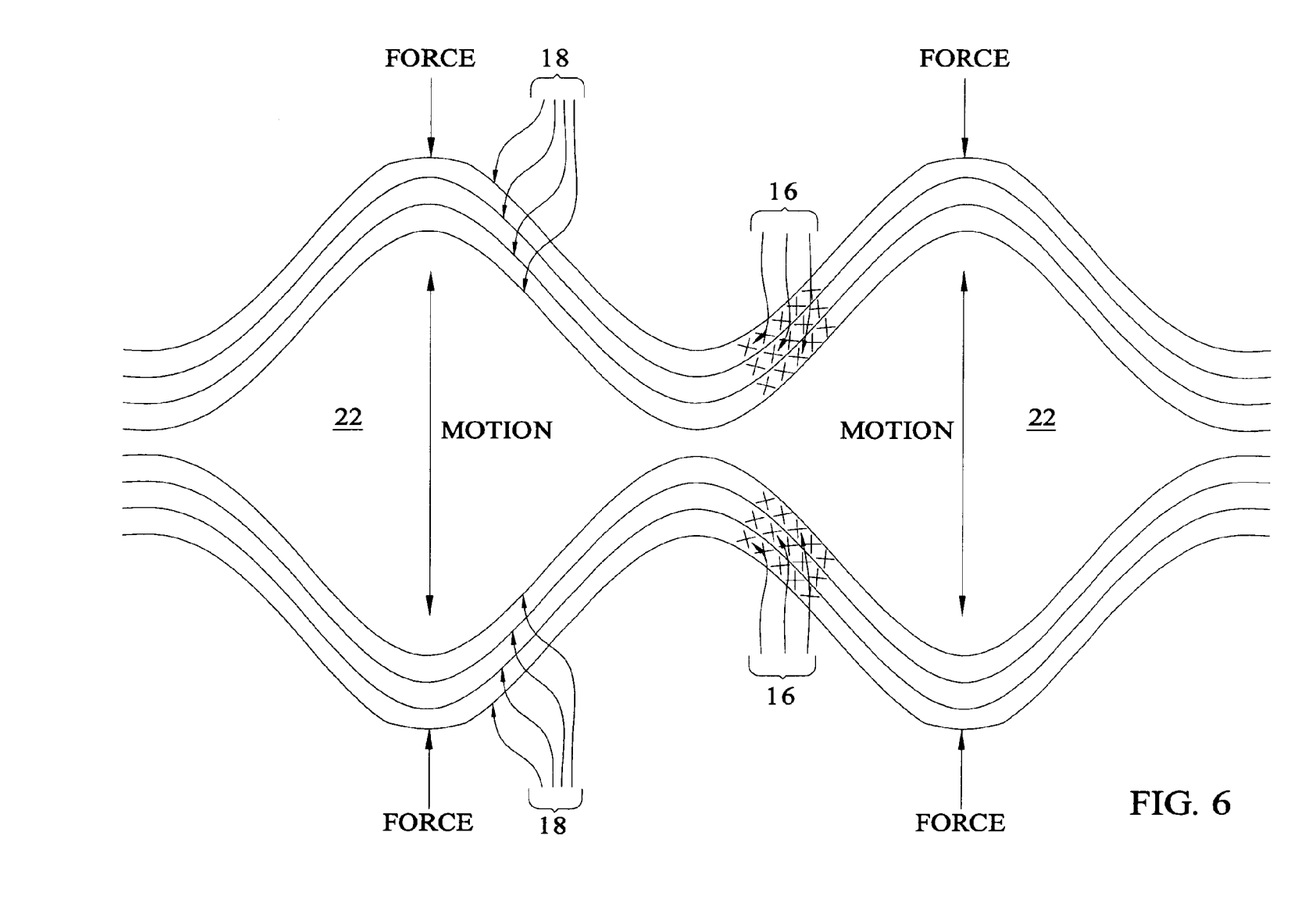
FIG. 6 shows yet another orientation of energy-producing polymers as may be used in the invention with accompanying shock-absorbing bladders also shown.

FIG. 6 depicts yet another possible arrangement of the sandwich structure, wherein voids 22 shown between the upper and lower sandwich structures may be filled with a very soft and easily compressed substance, such that when vertical forces are applied and then removed, the upper and lower sandwich structures will be forced toward each other and allowed to relax and return to a quiescent condition. This repeated forcing and subsequent flexing will, once again, generate voltage by virtue of the bending of the sandwich structure.

Obviously there are a great number of possible configurations for the non-piezoelectric polymers and electrodes which will permit flexing, distortion, bending, etcetera, and thus generate a useful voltage therefrom.

Referring again to FIG. 1, energy-generating polymer 16 is operably coupled to control circuitry 24 incorporated within shoe 12. Circuitry 24 is further connected to an electrical cord 25 so that the generated electricity can be utilized by equipment carried or stored on the person wearing footwear 10.

Figure 7:
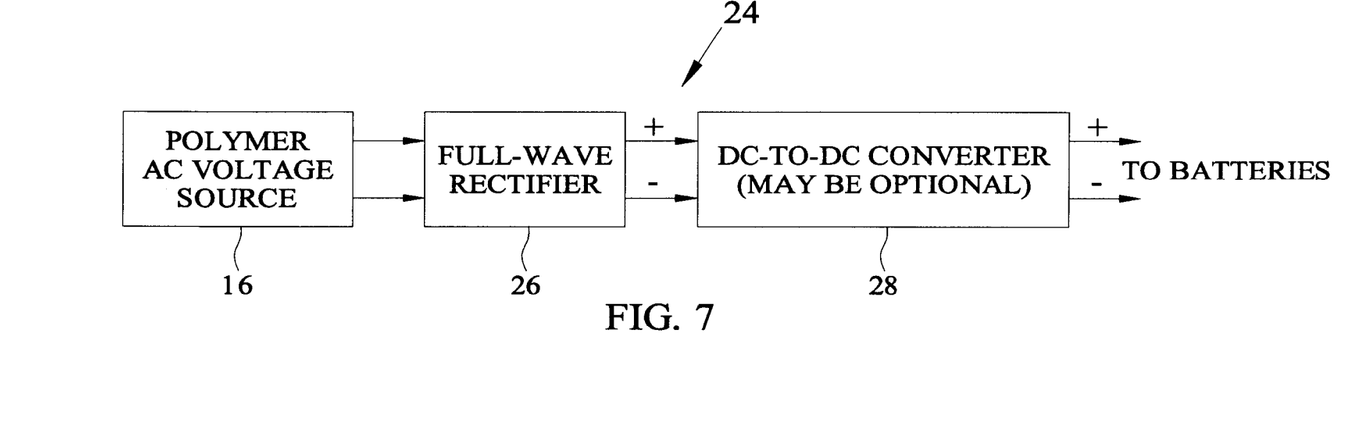
FIG. 7 illustrates a block diagram embodiment of the invention in which a full-wave rectification step is used.

In FIG. 7, a block diagram embodiment of the invention is shown as may be incorporated into footwear or other articles of clothing for energy generation. In FIG. 7, energy-generating polymer 16 shown is operably coupled to control circuitry 24.

Control circuitry 24 includes in this embodiment a full-wave rectifier component 26 operably coupled to an optional DC-to-DC converter 28 that provides conversion to a higher DC voltage level suitable for battery charging, for example. Such a DC-to-DC conversion process is sometimes carried out by what is known as a charge-pumping device. A similar AC-to-DC converting and utilization scheme incorporating a DC-to-DC converter is depicted and described in U.S. Pat. No. 5,552,656 incorporated by reference herein.

As shown in FIG. 7, the output of converter 28 may be sent to batteries (not shown) that are carried or otherwise stored by a wearer of the present invention.

Figure 8:
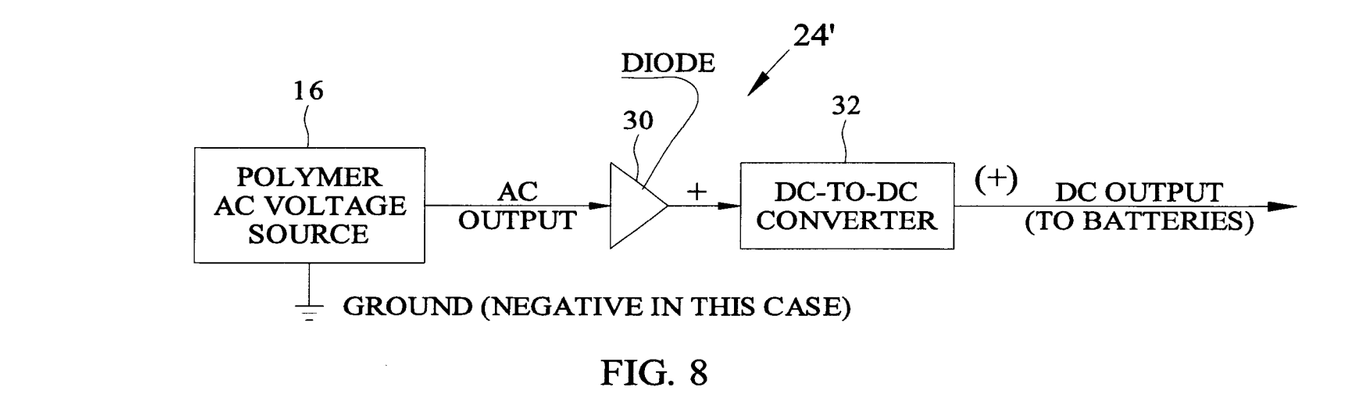
FIG. 8 is another block diagram embodiment of the invention in which a partial wave rectification step is used.

In FIG. 8, another block diagram embodiment of the invention is shown wherein polymer voltage source 16 is operably coupled to control circuitry 24' that, in this instance, includes a partial-wave rectifier 30, such as a diode, and an optional DC-to-DC converter 32 as described above.

Such an alternate AC-to-DC rectification scheme is similar, though perhaps less efficient that its full-wave counterpart. This latter scheme follows similar circuitry presented in U.S. Pat. No. 5,431,694, incorporated by reference herein, wherein a diode is employed as a rectifier and the voltage is shown relative to a negative ground.

A way to possibly increase the efficiency of the invention is to employ a reservoir capacitor, and accompanying control circuitry, in conjunction with the charging/recharging of batteries. Such an approach is illustrated on pages 119–124 of the Feb. 4, 1999 edition of EDN magazine wherein Allen Petersen of Maxim Integrated Products discloses a recharging scheme for use with solar panels. It can be surmised that solar panel energy output is somewhat analogous to that of the use of energy producing polymers, in that both cases will experience transients and fluctuations in energy output.

Figures 9, 9A:
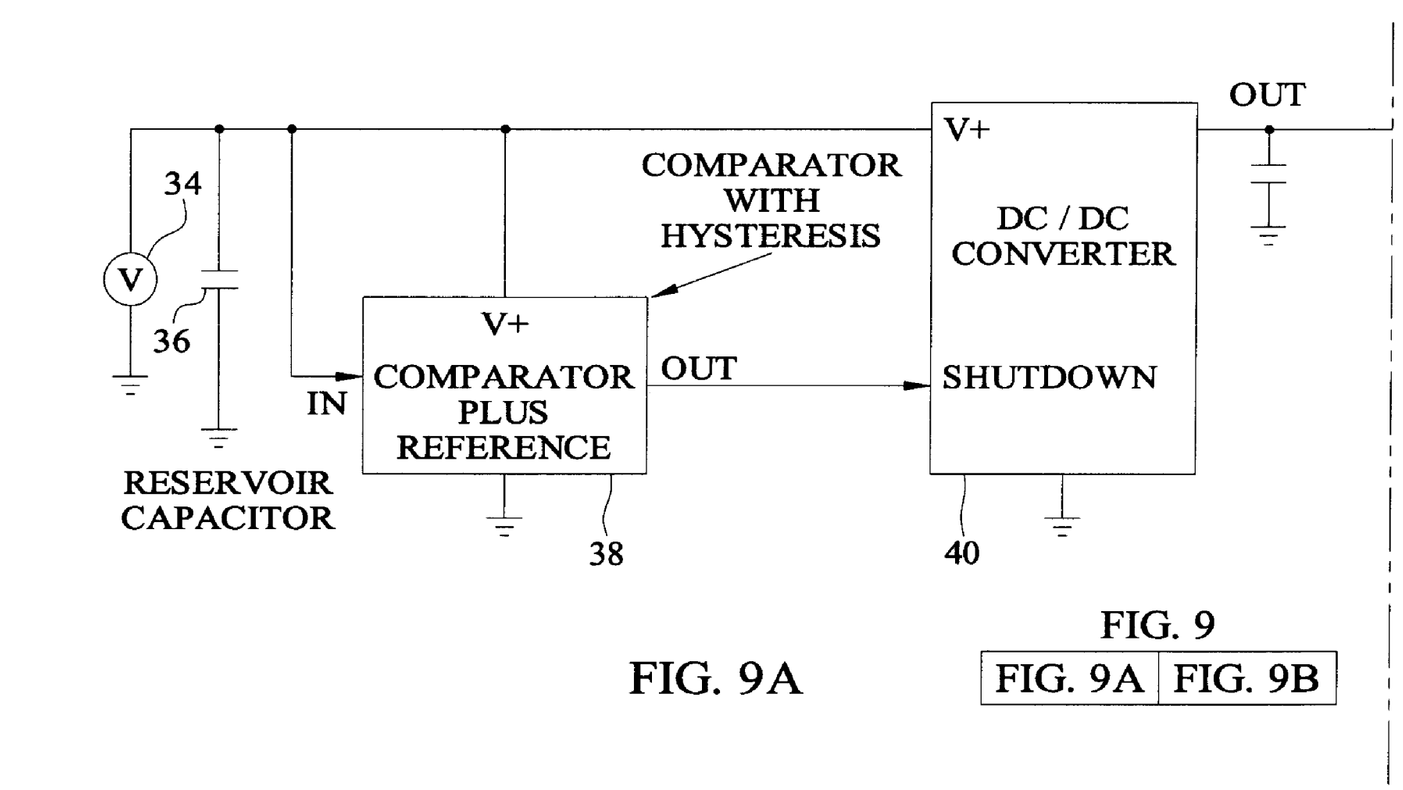
FIGS. 9A and 9B show an exemplary battery recharge circuit as may be used with the invention.
Figure 9B:
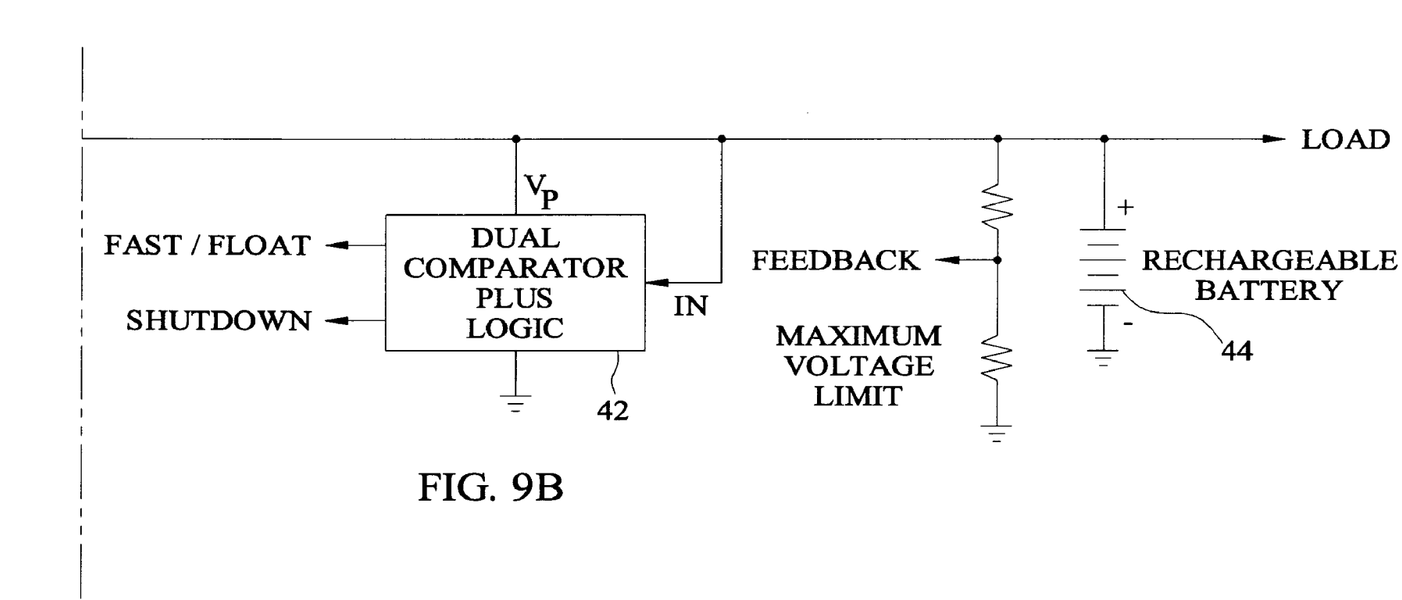

Referring now to FIG. 9, taken basically intact from the referenced article, voltage 34 generated from the electrostrictive polymer will be connected to reservoir capacitor 36. The voltage of capacitor 36 is monitored by a comparator 38 with hysteresis so that switch-mode converter 40 is turned on only when the polymer output is optimum. Capacitor 36 permits full cycle operation of converter 40 without allowing the converter's input voltage to drop beneath its operating voltage specification. A drop in voltage of capacitor 36 below a predetermined level, as set by the converter, will shut down the converter until the capacitor recharges to the optimum voltage. Thus the converter will perform battery charging only when the reservoir-capacitor is optimum for all levels of polymer usage. The circuit of FIG. 9 also includes a dual comparator plus logic 42 element to monitor the output voltage of battery 44. Comparator 42 permits fast, trickle or no charging of the battery based upon battery voltage levels.

Obviously, many modifications and variations of the invention are possible in light of the above teaching. It is therefore to be understood that within the scope of the appended claims the invention may be practiced otherwise than as has been specifically described.

What is claimed is:

1. An apparatus comprising:

an article of clothing that is subjected to flexure when worn;

a layer of electrostrictive polymer that is part of an ion-exchange polymer-metal composite, said layer incorporated into said clothing at a juncture wherein said clothing is typically flexed when worn so that said polymer is also flexed; and a rectifier circuit incorporated into said clothing and operably coupled to said electrostrictive layer for converting alternating current voltage generated by said polymer when flexed into direct current voltage.

2. The apparatus of claim 1 wherein said polymer is polyacrylic acid.

3. The apparatus of claim 1 wherein said polymer is polyvinyl chloride.

4. The apparatus of claim 1 wherein said polymer is poly (3,3'-phthalidylidene-4,4'-biphenylylene).

5. The apparatus of claim 1 wherein said rectifier circuit is a fill-wave rectifier circuit.

6. The apparatus of claim 1 wherein said rectifier circuit is a partial-wave rectifier circuit.

7. The apparatus of claim 6 wherein said partial-wave rectifier circuit includes a diode rectifier.

8. The apparatus of claim 1 further including:

a direct-current to direct-current converter incorporated into said clothing and operably coupled to said rectifier circuit for converting an input voltage level to said converter to an output voltage level that is higher than said input voltage level.

9. An energy-generating shoe comprising:

a sole;

a section of said sole in which a plurality of laminated electroded layers of electrostrictive polymer are electrically coupled in series and are disposed in a sinuous path to enhance flexure of said layers, said electroded layers of electrostrictive polymer being placed within said sole so that when said sole is flexed during walking said electrostrictive polymer is also flexed, thereby generating alternating current voltage energy;

a rectifier circuit incorporated within said sole and operably coupled to said electrostrictive polymer for converting said alternating current voltage generated by said polymer into direct current voltage; and an output power cord operably coupled to said rectifier circuit and exiting said shoe.

10. The apparatus of claim 9 wherein said laminated electroded layers of electrostrictive polymer are used in conjunction with reciprocable plungers that compress and expand upon the application of force thereto to further enhance flexure of said layers.

11. The apparatus of claim 9 wherein said laminated electroded layers of electrostrictive polymer are formed around compressible pockets that compress and expand upon the application and removal of force thereto, respectively, to further enhance the flexure of said layers.

12. The apparatus of claim 9 wherein said polymer is polyacrylic acid.

13. The apparatus of claim 9 wherein said polymer is polyvinyl chloride.

14. The apparatus of claim 9 wherein said polymer is poly (3,3'-phthalidylidene-4,4'-biphenylylene).

\* \* \* \* \*